(12) United States Patent
Davis

(10) Patent No.: US 11,508,533 B2
(45) Date of Patent: Nov. 22, 2022

(54) HIGH ENERGY DENSITY CAPACITOR SYSTEM AND METHOD

(71) Applicant: Flash Power Capacitors, LLC, Las Vegas, NV (US)

(72) Inventor: Edward L. Davis, Estacada, OR (US)

(73) Assignee: FLASH POWER CAPACITORS, LLC, Las Vegas, NV (US)

( * ) Notice: Subject to any disclaimer, the term of this patent is extended or adjusted under 35 U.S.C. 154(b) by 43 days.

(21) Appl. No.: 17/245,885

(22) Filed: Apr. 30, 2021

(65) Prior Publication Data

US 2021/0319959 A1 Oct. 14, 2021

Related U.S. Application Data

(60) Continuation of application No. 16/695,408, filed on Nov. 26, 2019, now Pat. No. 10,998,142, which is a
(Continued)

(51) Int. Cl.
*H01G 11/60* (2013.01)
*H01G 11/22* (2013.01)
(Continued)

(52) U.S. Cl.
CPC ............. *H01G 11/60* (2013.01); *H01G 7/02* (2013.01); *H01G 11/22* (2013.01); *H01G 11/52* (2013.01);
(Continued)

(58) Field of Classification Search
CPC .......... H01G 11/60; H01G 7/02; H01G 11/22; H01G 11/52; H01G 11/58; H01G 11/84;
(Continued)

(56) References Cited

U.S. PATENT DOCUMENTS 5,101,543 A * 4/1992 Cote .................... H04R 19/016
29/886
5,486,277 A 1/1996 Barbee, Jr
(Continued)

FOREIGN PATENT DOCUMENTS

EP 0490240 A2 6/1992
EP 1732146 A1 12/2006
(Continued)

*Primary Examiner* — Michael P McFadden
(74) *Attorney, Agent, or Firm* — DeLio Peterson & Curcio LLC; David R. Pegnataro

(57) ABSTRACT

A capacitor includes a first metal layer disposed on a wafer or substrate, a first polarized dielectric layer above the first metal layer and comprising a plurality of electrets formed by aligning molecular dipoles throughout a three-dimensional surface area of a polarizable dielectric material during polarization by applying a momentary electric field of positive or negative polarity, a second metal layer disposed on the first polarized dielectric layer to electrically isolate the first polarized dielectric layer, and a second polarized dielectric layer above the second metal layer, the second polarized dielectric layer comprising a plurality of electrets formed by aligning molecular dipoles throughout a three-dimensional surface area of a polarizable dielectric material during polarization by applying a second momentary electric field of opposing polarity. A plurality of alternating polarized dielectric layers and metal layers may be arranged in series to form a stack, with an internal passivation layer disposed between each stack.

12 Claims, 6 Drawing Sheets

Related U.S. Application Data division of application No. 15/942,705, filed on Apr. 2, 2018, now abandoned.

(60) Provisional application No. 62/556,640, filed on Sep. 11, 2017, provisional application No. 62/511,727, filed on May 26, 2017.

(51) Int. Cl.

| | |
|---|---|
| *H01G 11/86* | (2013.01) |
| *H01L 51/05* | (2006.01) |
| *H01G 11/52* | (2013.01) |
| *H01G 11/58* | (2013.01) |
| *H01G 11/84* | (2013.01) |
| *H01L 51/00* | (2006.01) |
| *H01G 7/02* | (2006.01) |
| *H01L 49/02* | (2006.01) |

(52) U.S. Cl.
CPC ............ *H01G 11/58* (2013.01); *H01G 11/84* (2013.01); *H01G 11/86* (2013.01); *H01L 28/40* (2013.01); *H01L 51/0007* (2013.01); *H01L 51/05* (2013.01)

(58) Field of Classification Search
CPC ..... H01G 11/86; H01L 28/40; H01L 51/0007; H01L 51/05
See application file for complete search history.

(56) References Cited

U.S. PATENT DOCUMENTS

| | | | |
|---|---|---|---|
| 5,985,731 A | 11/1999 | Weng et al. | |
| 6,001,299 A * | 12/1999 | Kawabe | H01G 7/02 264/436 |
| 6,936,994 B1 * | 8/2005 | Gimlan | B60L 8/006 320/101 |
| 7,428,137 B2 | 9/2008 | Dowgiallo, Jr. | |
| 8,315,032 B2 | 11/2012 | Tuncer | |
| 9,530,574 B1 | 12/2016 | Phillips | |
| 9,601,748 B2 | 3/2017 | Haag | |
| 10,020,125 B1 * | 7/2018 | Phillips | H01B 3/10 |
| 10,038,092 B1 | 7/2018 | Chen et al. | |
| 2002/0044480 A1 | 4/2002 | Gudesen et al. | |
| 2002/0132442 A1 | 9/2002 | Roy et al. | |
| 2003/0011043 A1 | 1/2003 | Roberts | |
| 2004/0175561 A1 | 9/2004 | Duff, Jr. | |
| 2005/0089188 A1 * | 4/2005 | Feng | H04R 19/016 381/396 |
| 2008/0266750 A1 | 10/2008 | Wu et al. | |
| 2008/0316678 A1 | 12/2008 | Ehrenberg et al. | |
| 2011/0000875 A1 | 1/2011 | Antonov et al. | |
| 2011/0007451 A1 * | 1/2011 | Fran | H01G 9/15 361/540 |
| 2013/0135790 A1 | 5/2013 | Tomioka et al. | |
| 2014/0063689 A1 | 3/2014 | Blair | |
| 2014/0367757 A1 | 12/2014 | Jakushokas et al. | |
| 2015/0062780 A1 | 3/2015 | Gadkaree et al. | |
| 2015/0103465 A1 | 4/2015 | Kang | |
| 2016/0351256 A1 | 12/2016 | Xia | |
| 2016/0351347 A1 * | 12/2016 | Tal-Gutelmacher | H01G 11/70 |
| 2017/0084402 A1 | 3/2017 | Gadkaree et al. | |
| 2019/0244933 A1 | 8/2019 | Or-Bach et al. | |
| 2020/0365353 A1 | 11/2020 | Rached | |

FOREIGN PATENT DOCUMENTS

| | | |
|---|---|---|
| WO | 2007012484 A1 | 2/2007 |
| WO | 2010029161 A1 | 9/2009 |

\* cited by examiner

HIGH ENERGY DENSITY CAPACITOR SYSTEM AND METHOD

RELATED APPLICATIONS

This application claims priority to U.S. Provisional Patent Application No. 62/511,727 filed May 26, 2017, and U.S. Provisional Patent Application No. 62/556,640 filed Sep. 11, 2017, the entire disclosures of which are incorporated herein by reference.

BACKGROUND OF THE INVENTION

1. Field of the Invention

Embodiments of the present invention relate generally to energy storage.

2. Description of Related Art

The potential energy in a capacitor is stored in an electric field, whereas a battery stores its potential energy in a chemical form. The technology for chemical storage currently yields greater energy densities (capable of storing more energy per weight) than capacitors, but batteries require much longer to charge.

Prior art ultra-capacitors have energy densities far below comparably sized batteries of any modern chemistry on the market. The highest energy density ultra-capacitor commercially available today is Maxwell at 6 Wh/kg. Batteries like lithium ion are over 100 Wh/kg.

There is a significant need for high energy density capacitors to replace batteries in many applications (e.g., electric vehicles and other modes of transportation including planes or trains, cell phones, backup storage for utilities, windmills, and any other type of electrical facility) because capacitors can be charged and discharged very rapidly and last for many thousands, even millions of cycles. Whereas, batteries typically charge very slowly and last only a couple thousand full cycles at most, and much less if discharged more than fifty percent (50%) each cycle. Further, capacitors are not hazardous and do not have any of the safety issues typically associated with batteries.

SUMMARY OF THE INVENTION

Bearing in mind the problems and deficiencies of the prior art, it is therefore an object of the present invention to provide an improved capacitor having a higher energy density.

It is another object of the present invention to provide an improved capacitor having a three-dimensional dielectric surface.

A further object of the invention is to provide an improved capacitor by substantially increasing the dielectric constant "k", while shrinking the distance between the plates.

It is yet another object of the present invention to provide an improved method of forming a capacitor utilizing standard semiconductor fabrication techniques by adding a supplemental apparatus to aid in polarization alignment.

Still other objects and advantages of the invention will in part be obvious and will in part be apparent from the specification.

The above and other objects, which will be apparent to those skilled in the art, are achieved in the present invention which is directed to a high energy density capacitor comprising a substrate and at least one dielectric layer disposed between a positive electrode and a negative electrode. A metal layer is deposited on each of the dielectric layers for attachment to the poles of the electrodes. The positive and negative electrodes extend along a height of the capacitor and have poles in an alternating arrangement around an edge thereof, such that the positive and negative electrodes are attached to periodic metal layers deposited on each of the intermediate dielectric layers. Each intermediate dielectric layer is polarized such that its dipoles are aligned in an opposite direction of an electric field created between the positive and negative electrodes while charging.

In one or more embodiments, the capacitor of the present invention is a multi-layer capacitor comprising internal passivation layers disposed between each capacitor stack, wherein a stack consists of a plurality of intermediate dielectric layers and metal layers arranged in series.

Each intermediate dielectric layer is comprised of a high surface area dielectric material, an electrolyte and a polar organic solvent, and is formed by depositing sequential layers of the high surface area dielectric material, the electrolyte and the polar organic solvent onto the substrate using semiconductor fabrication techniques. The high surface area dielectric material has a dielectric constant in the range of about $10^9$ to about $10^{11}$.

In one or more embodiments, the polar organic solvent may be a polar protic solvent selected from the group comprising $NH_3$, $(CH_3)_3COH$, $C_3H_8O$, $C_2H_6O$, $CH_3OH$, $CH_3COOH$, and $H_2O$. In other embodiments, the polar organic solvent may be a polar aprotic solvent selected from the group comprising $C_3H_6O$, $(CH_3)_2NCH$, $CH_3CN$, $C_2H_6OS$, $CH_2Cl_2$, $C_4H_8O$, and $C_4H_8O_2$. Each intermediate dielectric layer may be comprised by molar percentage of about three percent (3%) to about twenty percent (20%) electrolyte, about three percent (3%) to about twenty percent (20%) dielectric material, and about sixty percent (60%) to about ninety-four percent (94%) polar organic solvent.

In another aspect, the present invention is directed to a method of forming a high energy density capacitor, comprising: providing a substrate, providing a positive electrode disposed on the substrate and a negative electrode opposite the positive electrode, providing at least one intermediate dielectric layer disposed between the positive electrode and negative electrode, and providing a metal layer deposited on each of the at least one intermediate dielectric layers. Each intermediate dielectric layer is comprised of a high surface area dielectric material, an electrolyte and a polar organic solvent, and is formed by depositing sequential layers of the high surface area dielectric material, the electrolyte and the polar organic solvent onto the substrate using semiconductor fabrication techniques.

The method may comprise positioning the positive and negative electrodes to extend along a height of the capacitor such that the poles of the electrodes are in an alternating arrangement around an edge thereof, and attaching the positive and negative electrodes to periodic metal layers deposited on each of the at least one intermediate dielectric layers. The dipoles of each intermediate dielectric layer may be aligned such that the polarized dielectric layer opposes an electric field created between the positive and negative electrodes while charging.

In one or more embodiments, the method may include providing a plurality of intermediate dielectric layers and metal layers arranged in series to form a stack, and providing at least one internal passivation layer disposed between each stack.

In one or more embodiments, the polar organic solvent in the intermediate dielectric layer may be a polar protic solvent selected from the group comprising $NH_3$, $(CH_3)_3COH$, $C_3H_8O$, $C_2H_6O$, $CH_3OH$, $CH_3COOH$, and $H_2O$. In other embodiments, the polar organic solvent may be a polar aprotic solvent selected from the group comprising $C_3H_6O$, $(CH_3)_2NCH$, $CH_3CN$, $C_2H_6OS$, $CH_2Cl_2$, $C_4H_8O$, and $C_4H_8O_2$.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE EMBODIMENT(S)

Figure 1:
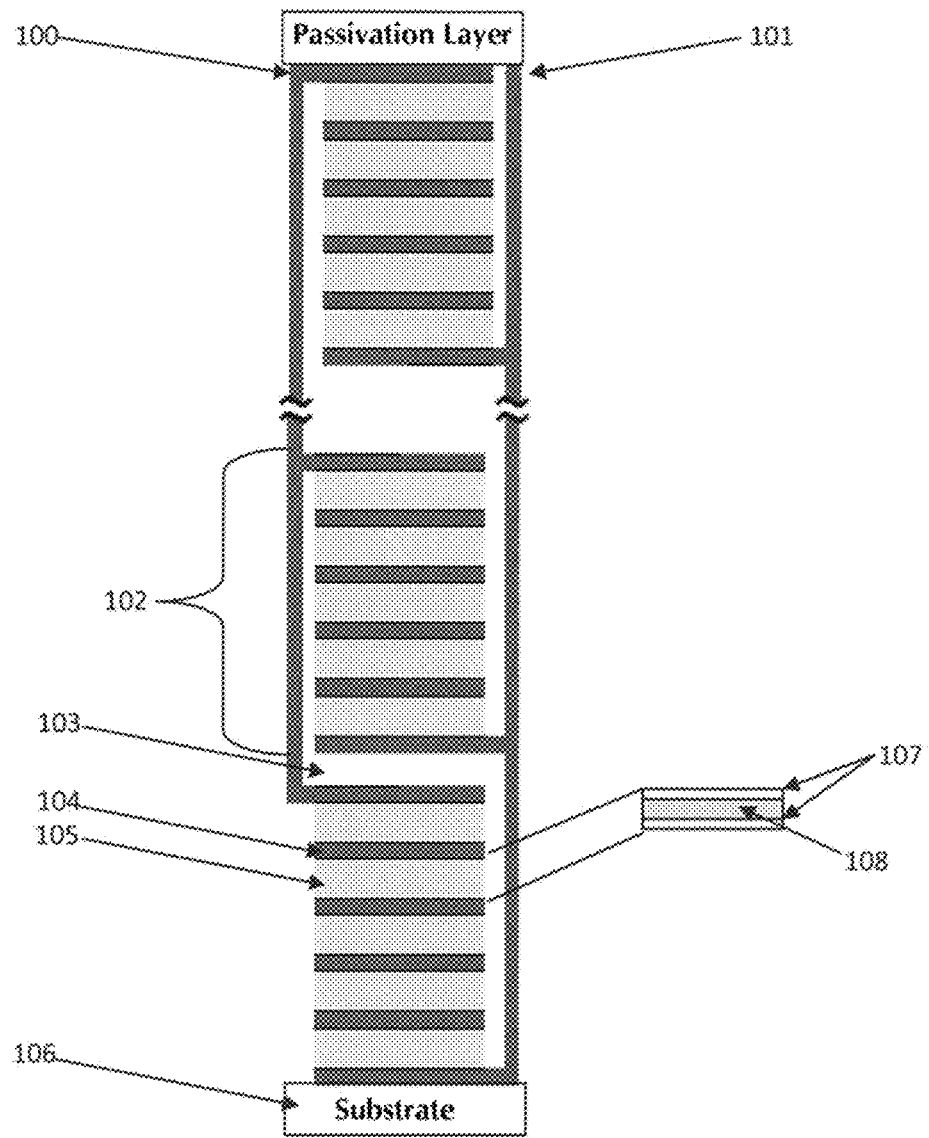
FIG. 1 depicts a wafer or panel with layers of metal and dielectric layers, in accordance with disclosed embodiments of the present invention.

In describing the embodiments of the present invention, reference will be made herein to FIGS. 1-7 of the drawings in which like numerals refer to like features of the invention.

The high energy density capacitor of the present invention provides a solution for replacing slow charging, short-life batteries with quick charging, long-life capacitors. The method of forming the capacitor(s) of the present invention utilizes atomic layer deposition (ALD), metal oxide chemical vapor deposition (MOCVD), Electrospray, Sputtering, 3D printing and other semiconducting fabrication equipment to produce sub-micron thin layers and the capability for at least twelve (12) inch wafers and/or rectangular substrates, like those used for LED panels, which are available in a wide variety of generations and sizes. Wafers may also be sawed into any shape or size and stacked to any height.

The instant invention takes advantage of these advances by utilizing a large array of ALD machines and other standard semiconducting fabrication machinery, 3D printing and robotic automation to apply up to thousands of layers per day to mass produce the capacitors in any shape or size.

The primary advantage that batteries currently have over prior art capacitors is energy density. The capacitor of the present invention eliminates this barrier.

Certain terminology is used herein for convenience only and is not to be taken as a limitation of the invention. For example, words such as "upper," "lower," "left," "right," "horizontal," "vertical," "upward," and "downward" merely describe the configuration shown in the drawings. For purposes of clarity, the same reference numbers may be used in the drawings to identify similar elements.

Additionally, in the subject description, the word "exemplary" is used to mean serving as an example, instance or illustration. Any aspect or design described herein as "exemplary" is not necessarily intended to be construed as preferred or advantageous over other aspects or design. Rather, the use of the word "exemplary" is merely intended to present concepts in a concrete fashion.

Referring now to FIG. 1, an exemplary high energy density capacitor of the present invention is shown. The capacitor includes a wafer or substrate upon which is deposited alternating layers of metal and dielectric layers, and further includes a positive electrode 100, a negative electrode 101, and a "stack" of five (5) capacitors 102, which makes a 25 volt stack at one-fifth ($\frac{1}{5}^{th}$) the capacitance of a single instantiation, since the five are in series. It should be understood by those skilled in the art that a "stack" of five capacitors is being shown for exemplary purposes only, and that any number of capacitors may be implemented, in series, in order to achieve the desired voltage per design requirements, as will be described below. A passivation layer 103 or insulator isolates the "stacks" 102. A metal layer 104, an ultra-dielectric material (UDM) layer 105, and the substrate or wafer 106 complete the assembly, in accordance with disclosed embodiments of the present invention.

Figure 2:
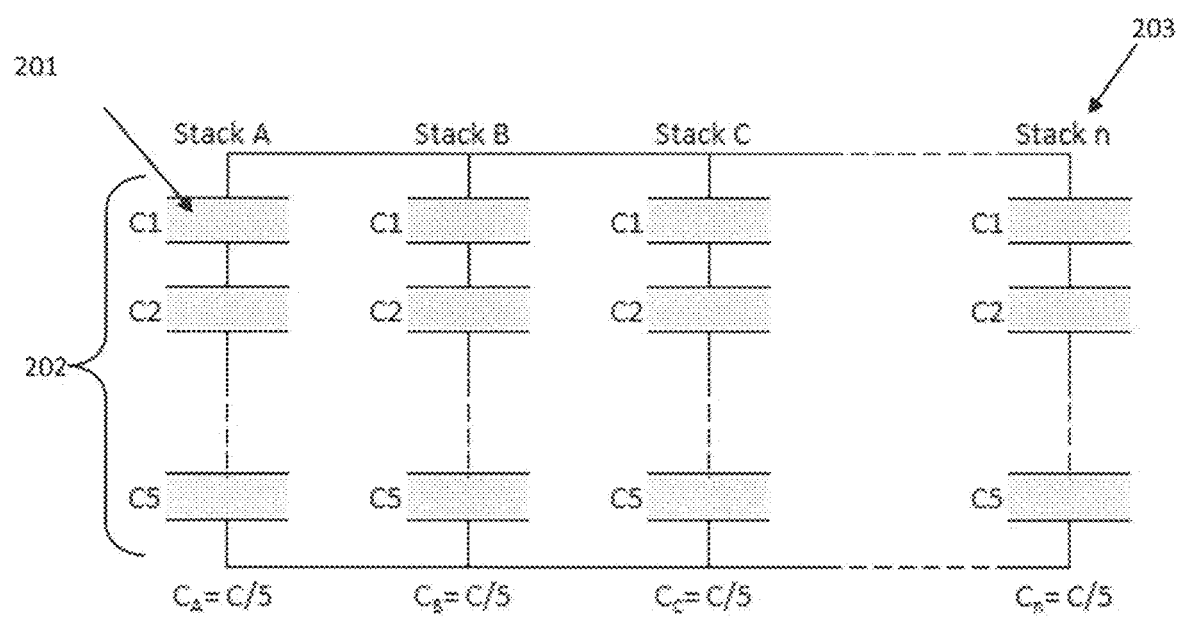
FIG. 2 depicts the capacitors of the present invention in serial parallel arrays, in accordance with disclosed embodiments.

FIG. 2 depicts how a plurality of capacitors are organized in serial parallel arrays, in accordance with disclosed embodiments. Capacitor 201 is a single capacitor formed with UDM and metal layers. Stack 202 depicts a stack of five (5) capacitors in series. Putting capacitors in series lowers the capacitance, but it is necessary to increase the voltage. By way of example herein, each capacitor 201 is rated at 5 volts, therefore the stack 202 is rated up to 25 volts, albeit at one-fifth ($\frac{1}{5}^{th}$) the capacitance of a single capacitor. The total capacitance is increased by arranging an array of stacks in parallel, because capacitors in parallel sum. Up to n stacks 203 may be created until the desired level of energy storage is achieved.

Capacitance is defined as:

$$C=(k\varepsilon_0 A)/d$$

where:
C=Capacitance (Farads)
k=Dielectric multiplier
$\varepsilon_0$=permittivity constant
A=Area of the plates ($m^2$)
d=distance between plates ($\mu m$)

The present invention produces a high capacitance EDLC-type electrochemical capacitor by substantially increasing the dielectric constant "k", while shrinking the distance between the plates.

Figure 3:
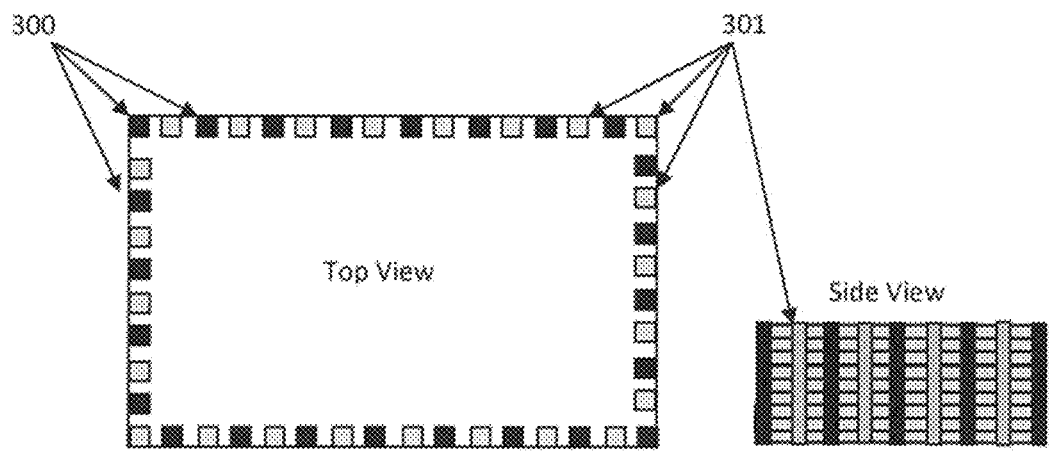
FIG. 3 depicts the capacitors of the present invention having an alternating anode and cathode pole arrangement around the edge of the device in order to get the charge in and out quickly with minimal effective series resistance (ESR).

Referring now to FIG. 3, the capacitors' alternating anode 300 and cathode 301 pole arrangement around the edge of the capacitor device is shown. Alternating poles in such a way allows the charge in and out quickly with minimal effective series resistance (ESR). In larger capacitors, additional positive and negative electrodes may be dispersed intermittently in the interior of the capacitor device, and may be arranged around the center of the device. As shown in the side view of FIG. 3, the electrodes extend along the full height of the capacitor array, even though these poles only attach to the metal layers periodically. In one embodiment, the electrodes 301 are attached to every fifth layer (as depicted in FIG. 1), in order to achieve 25 volt stacks. The unconnected layers may be masked to create a gap between the metal layers 501 and the electrodes 300, 301.

Figure 4:
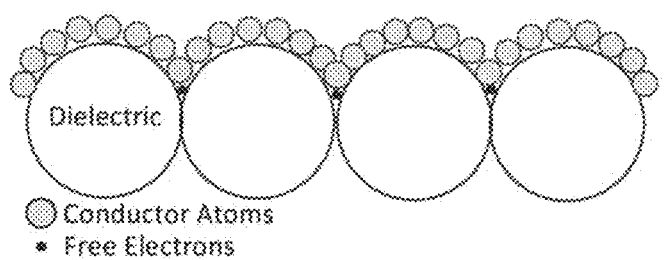
FIG. 4 depicts the dielectric surface area of a capacitor in accordance with embodiments of the present invention, wherein surface area "A" is a three dimensional (3D) surface area, as opposed to two dimensional (2D).

FIG. 4 depicts the dielectric surface area of an embodiment of a capacitor of the present invention. Of particular note is that surface area "A" is a three dimensional (3D) surface area, not 2D. The atomic layer of conducting atoms snuggle in around the dielectric atoms, forming a three dimensional structure which yields a much higher surface area than just the 2D. It's the 3D surface area which in this case is the surface area for a bunch of half spheres, i.e. $\frac{1}{2}*(4\pi r^2)$ multiplied by the number of atoms or molecules in the length by width area.

Figure 5:
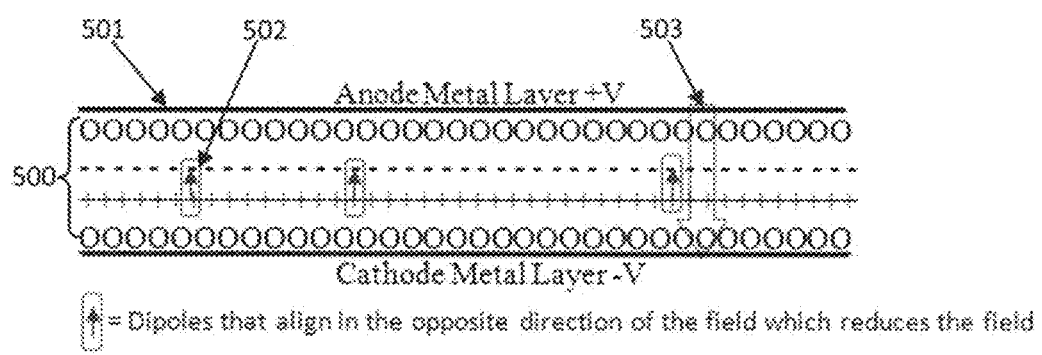
FIG. 5 depicts the capacitor layer anatomy of a capacitor in accordance with disclosed embodiments of the present invention.

FIG. 5 depicts the capacitor layer anatomy of one embodiment of the capacitor of the present invention, comprising anode and cathode metal layers 501, with layers of high surface area dielectric material (such as silica) and positive and negative atomic layers disposed therebetween. FIG. 5 illustrates how the dipoles 502 in the dielectric layer 500 align with the electric field 503 of the capacitor, but in the opposite direction, which leads to a reduction in the total field, and an increase in the total quantity of charge that the capacitor can hold for a given voltage/applied field. As a result, more charge can build up on the positive and negative electrodes 501. The "k" in physics is determined by the degree of polarization that the dielectric layers 500 can undergo, in other words, how many dipoles 502 are available inside the "N"-type and "P"-type atomic layers to reduce the applied field across the capacitor, thereby allowing more charge to be stored on the plates.

The metal atoms with their conduction band and free electrons snuggle in around the hemispherical surfaces of the top of the dielectric layer (FIG. 4). Using pairs of high voltage plates to align the dipoles, as will be described in more detail below, the dielectric layers become "electrets," equivalent to magnets; however, instead of aligning magnetic domains, the high energy density capacitor of the present invention comprises aligning electric dipole domains.

The present invention optimizes energy density by maximizing the operating voltage. Some polar organic solvents have breakdown voltages three (3) to four (4) times higher than distilled water, and some are in the 5V range at micron thicknesses. By contrast, distilled water breakdown voltage limits the operating voltage to 0.8 to 1.2 volts per cell. The present invention also encompasses replacing the polar protic solvents with electric dipole materials, electrets, that are deposited and aligned to oppose the main electric field created when the capacitor is charging.

One advantage of the present invention is that each capacitor may have a thickness of much less than 1 micron ($\mu m$) to optimize energy density while increasing capacitance.

The ultra-dielectric materials (UDM) utilized in one embodiment comprise a combination of a polar organic solvent from Table 1 below, an electrolyte from Table 2 below, and a high surface area dielectric material from Table 3 below. In an embodiment, polar protic solvents are used for their high dielectric constants and high dipole moments. In other embodiments, polar aprotic solvents work well also, e.g., DMSO, KCl, and $SiO_2$ or DMSO, NaCl, and $SiO_2$, and therefore it should be understood by those skilled in the art that the present invention encompasses such alternative compositions which include a polar aprotic solvent in place of a polar protic solvent.

TABLE 1

Polar Protic/Aprotic Solvents

| Polar Solvents | Protic or Aprotic | Dielectric Constant | Dipole Moment | Break Down Volts[1] |
|---|---|---|---|---|
| Ammonia | protic | 25 | 1.40 D | |
| t-Butanol | protic | 12 | 1.70 D | |
| t-Propanol | protic | 20 | 1.68 D | |
| Ethanol | protic | 25 | 1.69 D | |
| Methanol | protic | 33 | 1.70 D | |
| Acetic Acid | protic | 6.2 | 1.74 D | |
| Water | protic | 80 | 1.85 D | .8–1.2 |
| Acetone | aprotic | 25 | 1.40 D | |
| Dimethylformamide (DMF) | aprotic | 12 | 1.70 D | |
| Acetontrile (MeCN) | aprotic | 20 | 1.68 D | |
| Dimethyl Sulfoxide (DMSO) | aprotic | 25 | 1.68 D | |
| Dichloromethane | aprotic | 9.1 | 1.50 D | |
| Tetrahydrofuran (THF) | aprotic | 7.5 | 1.75 D | |
| Ethyl Acetate | aprotic | 6 | 1.78 D | |

TABLE 2

Electrolyte Materials

NaCL
$NH_4CL$
KCl

TABLE 3

High Surface Area Dielectric materials

| High Surface Area Dielectric Materials | In situ k |
|---|---|
| Pyrogenic Silica (Fumed Silica) | $10^{10}$ to $10^{11}$ |
| Silicon Dioxide ($SiO_2$) | $\sim 10^{10}$ |
| Alumina | $10^9$ to $10^{10}$ |

In one exemplary embodiment, ammonia ($NH_3$) is used as the polar protic solvent, $NH_4CL$ is the electrolyte, and silicon dioxide is the high surface area dielectric material.

In an embodiment, these materials are each deposited in sequential layers onto the wafer or substrate to build up a half micron (0.5 $\mu m$) layer of UDM material 105 using semiconductor processing equipment and/or 3D printers. Then a quarter micron (0.25 $\mu m$) layer of metal 104 is deposited on top of the UDM layer 105. This is repeated in an alternating process until five (5) complete UDM/metal sandwich layers are completed, thereby forming a 25 volt stack 102.

The three UDM compounds are built up sequentially in molar percentages of about three percent (3%) to about twenty percent (20%) electrolyte (Table 2), about three percent (3%) to about twenty percent (20%) dielectric materials (Table 3), and about sixty percent (60%) to about ninety-four percent (94%) polar organic solvent (Table 1).

These UDM compounds yield dielectric k values in the $10^8$ to $10^{11}$ range.

Table 4 below reveals the high energy density of an embodiment of the capacitor of the present invention using a six (6) inch wafer and assuming k is at the median point of the range of about $10^{10}$. The UDM dielectric layer thickness is 0.5 $\mu m$ in this example. Stacks of five layers in series creates a 25 volt capacitor. This embodiment yields 56.1 kWh of capacity with only 100 stacks.

TABLE 4

A six inch wafer at the median k range

| k | $\varepsilon_c$ | A | d | F/lyr | Lyrs | F/stk | Par Stks | F Total | $J = CV^2/2$ | kWh |
|---|---|---|---|---|---|---|---|---|---|---|
| 1.00E+10 | 8.85E−12 | 0.182415 | 5.00E−07 | 3.23E+04 | 5 | 6560.5 | 100 | 646,055 | 201,892,084 | 56.1 |

In one embodiment, the Fumed Silica utilized was 7 nm Aldrich powder.

Capacitors made in accordance with the present invention may have a life cycle of more than 1,000,000 cycles even at deep discharge rates, e.g., eighty percent (80%) depth of discharge ("DoD"). The charge time for each capacitor may be about 30 seconds for full recharge.

After the wafers or panels are processed, the capacitors may be sawed in various shapes and sizes and placed into the final packaging using activated carbon, graphene or other type electrodes.

These capacitors may be used in electric vehicles (EVs) and charged using a "Capacitive Wireless Charging System and Method," as described in patent application Ser. No. 62/511,754, filed May 26, 2017, by the same inventor, which may be easily installed in existing service stations. Other applications for the improved high energy density capacitor of the present invention include not only vehicles, but other modes of transportation including planes or trains, backup storage for utilities, windmills, and any other type of electrical facilities.

In another embodiment, the wafers or substrates may be twelve (12") inch (~300 mm), but any size wafer or even rectangular LED panels will work in ALD, MOCVD and other semiconductor or 3D printing systems. Up to 370 mm×470 mm panels may be used to make rectangular capacitors. It is further contemplated by the present invention that larger panels may be used as they become available in the future.

In one embodiment according to the present invention is a two solvent mixture of ethylene glycol and a polar organic cosolvent from Table 1. Boric acid is dissolved in this mixture with a carboxylic acid.

Figure 6:
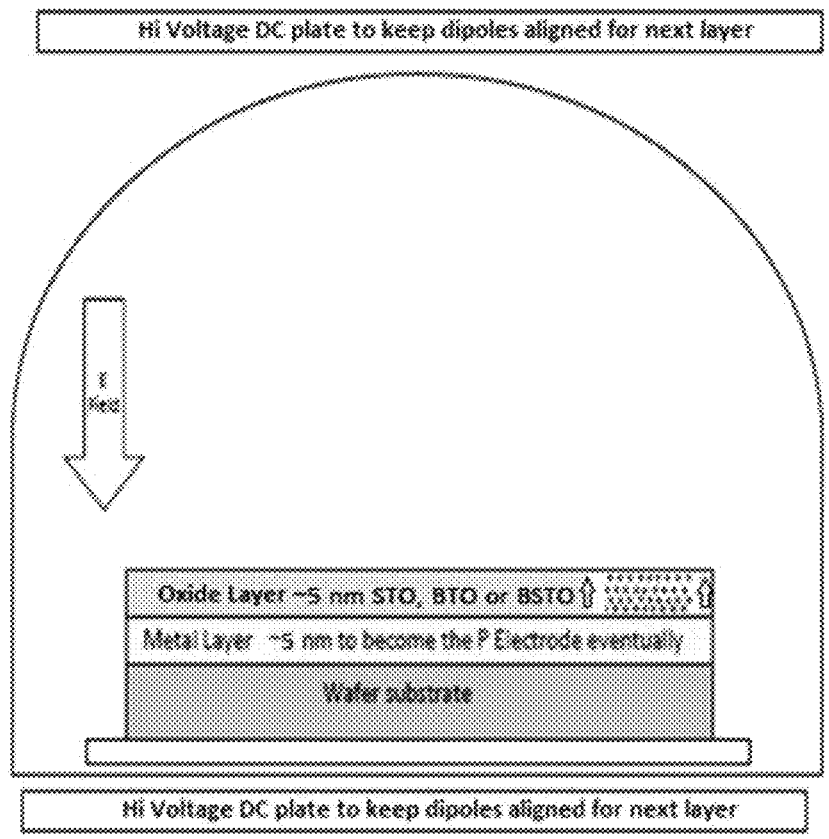
FIG. 6 depicts a deposition chamber used in an exemplary process for forming a capacitor in accordance with embodiments of the present invention.

A deposition chamber used in an exemplary solid state process for forming a capacitor in accordance with embodiments of the present invention is shown in FIG. 6. Dipoles structures in each dielectric layer are fabricated by depositing a layer of polarized dielectric material and aligning the dipoles using high voltage plates. This process requires minimal layers per capacitor.

Capacitive plates are placed above and below the deposition chamber external to the chamber and a high voltage DC is applied. One capacitive plate takes on a high positive Voltage and the other a high negative Voltage, to ensure that the dipoles remain aligned while applying each subsequent layer. During ion deposition, the small dipoles in the Oxide layer align in the opposite direction of the Electric Field. After each layer is completed, the dipoles will remain aligned after the external Electric Field is removed. Consequently, the dielectric k value increases by several orders of magnitude and the breakdown voltages increase by an order of magnitude or more over what is conventionally expected. An advantage of this solid state deposition process is that many layers may be built up to make very large capacitors.

Figure 7:
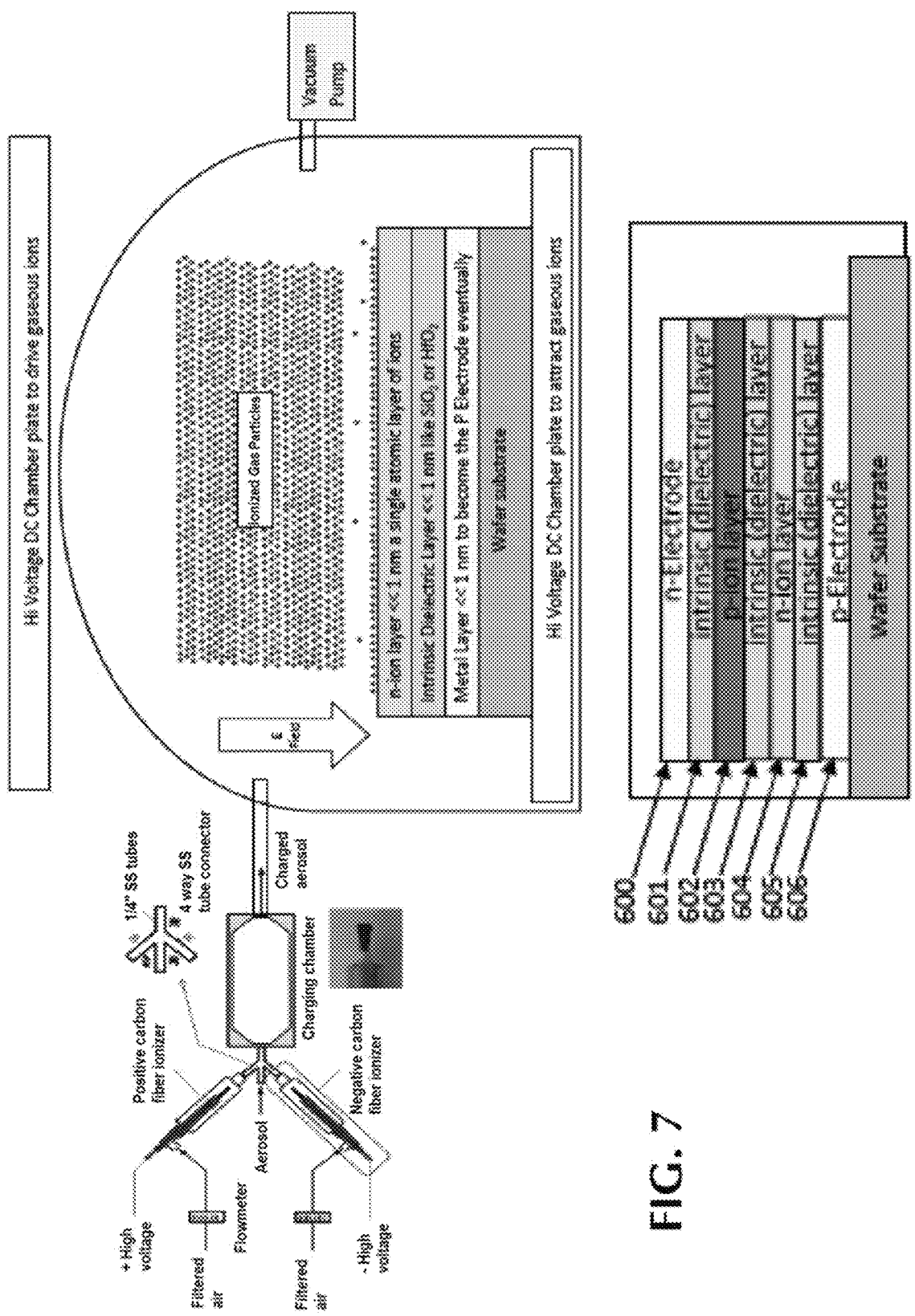
FIG. 7 depicts a deposition chamber used in a second exemplary process for forming a capacitor in accordance with embodiments of the present invention.

Referring now to FIG. 7, an atomic layer deposition (ALD) chamber used in a second, different solid state process for forming a high energy density capacitor of the present invention is shown. In this process, the dipole structures are fabricated in a sandwich of alternating layers of ions and dielectric by first depositing a layer of dielectric 605 disposed above the p-Electrode 606, then a layer of n-ions 604, another layer of dielectric 603, a layer of p-ions 602, and another layer of dielectric 601 to insulate the p-ions from the n-Electrode 600. This process requires more layers per capacitor.

As shown in FIG. 7, a wafer or substrate is placed at the bottom of the deposition chamber, and aligned with the positive electrode or p-Electrode. The first layer of ions is deposited by filling the chamber with ionic gas and placing a High Voltage plate inside the chamber beneath the substrate or wafer, as well as placing a High Voltage plate having an opposite voltage above and external to the chamber, to create a strong Electric Field by applying a DC Voltage. The stronger the Electric field applied, the more densely the layer of ions is able to be packed. Next, the chamber is cleared, and a dielectric layer is applied to hold the ions (up to five atomic layers may be required), before removing the Electric field. The chamber is then flooded with a positive ion gas and the voltage on the plates is reversed. As the Positive ions get close to the dielectric layer, the Negative ions underneath the dielectric layer attract the Positive ions and align them overhead, creating smaller dipoles. On each successive layer, the process of reversing the chamber plate Voltage is repeated, selecting the other ionizing tip, as necessary. It is further contemplated by the present invention that the positive and negative ions may instead be replaced by a mixture of bare electrons and protons. In another embodiment, electrospray may be used to deposit the ion layers.

It is contemplated that other low cost, high fidelity methods may be used to deposit the dielectric layer. For example, technologies that may be suitable for producing dielectric layers of appropriate thickness include spin-coating, spray-coating, or screen printing. Generally, roll-to-roll coating methods are considered suitable.

Thus, the present invention achieves one or more of the following advantages. The capacitor of the present invention provides a solution for replacing slow charging, short-life batteries with quick charging, long-life capacitors having a significant higher energy density than prior art capacitors. The method of forming the capacitor(s) of the present invention utilizes atomic layer deposition (ALD), metal oxide chemical vapor deposition (MOCVD), 3D printing and other semiconducting fabrication equipment to produce sub-micron thin layers and the capability for 12 inch wafers and/or rectangular substrates, like those used for LED panels, which are available in a wide variety of generations and sizes. Wafers may also be sawed into any shape or size and stacked to any height. The instant invention takes advantage of these advances by utilizing a large array of ALD machines and other standard semiconducting fabrication machinery, 3D printing and robotic automation to apply up to thousands of layers per day to mass produce the capacitors of the present invention in any shape or size.

While the present invention has been particularly described, in conjunction with specific embodiments, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A capacitor, comprising:
   a wafer or substrate;
   a first metal layer disposed on the wafer or substrate;
   a first polarized dielectric layer above the first metal layer, the first polarized dielectric layer comprising a plurality of electrets formed by aligning molecular dipoles throughout a three-dimensional surface area of polarizable dielectric material during polarization by applying a momentary electric field of positive or negative polarity to the polarizable dielectric material;
   a second metal layer disposed on the first polarized dielectric layer to electrically isolate the first polarized dielectric layer; and
   a second polarized dielectric layer above the second metal layer, the second polarized dielectric layer comprising one or more electrets formed by aligning molecular dipoles throughout a three-dimensional surface area of polarizable dielectric material during polarization by applying a second momentary electric field of opposing polarity to the polarizable dielectric material.

2. The capacitor of claim 1 wherein the polarizable dielectric material comprises a high K dielectric material.

3. The capacitor of claim 2 wherein each layer of polarizable dielectric material is comprised of high K material in the K>1000 range.

4. The capacitor of claim 1 wherein the first and second momentary electric fields are applied using capacitive plates disposed above and below the wafer or substrate and applying a designated voltage.

5. The capacitor of claim 4 wherein the designated voltage is about 1500 volts DC or greater.

6. The capacitor of claim 1 further comprising:
   a plurality of alternating polarized dielectric layers and metal layers arranged in series to form a stack; and
   at least one internal passivation layer disposed between each stack.

7. The capacitor of claim 1 wherein the first and second polarized dielectric layers are arranged in parallel.

8. The capacitor of claim 1 wherein the first and second polarized dielectric layers are arranged in series.

9. The capacitor of claim 1 wherein each polarized dielectric material has a dielectric constant in the range of about $10^9$ to about $10^{12}$ after application of said momentary electric fields.

10. The capacitor of claim 1 wherein polarity of the first and second momentary electric fields is selected dependent upon whether the first and second layers of polarizable dielectric material are arranged in parallel or in series, and further dependent upon direction the first or second layer needed to be polarized.

11. The capacitor of claim 1 further comprising sequential layers of polarizable dielectric material deposited using semiconductor fabrication techniques.

12. The capacitor of claim 11 wherein the sequential layers of polarizable dielectric material are deposited using atomic layer deposition.

* * * * *

UNITED STATES PATENT AND TRADEMARK OFFICE
CERTIFICATE OF CORRECTION

| | |
|---|---|
| PATENT NO. | : 11,508,533 B2 |
| APPLICATION NO. | : 17/245885 |
| DATED | : November 22, 2022 |
| INVENTOR(S) | : Edward L. Davis |

It is certified that error appears in the above-identified patent and that said Letters Patent is hereby corrected as shown below:

In the Specification

Column 6, Table 1, Line 9, change "t-Propanol" to "n-Propanol"

Column 6, Table 1, Line 17, change "1.50 D" to "1.60 D"

Column 7, Table 4, Line 2, change "6560.5" to "6460.5"

Signed and Sealed this
Fifth Day of September, 2023

Katherine Kelly Vidal
*Director of the United States Patent and Trademark Office*